(12) United States Patent
Johansson et al.

(10) Patent No.: US 12,125,951 B2
(45) Date of Patent: Oct. 22, 2024

(54) STRUCTURE, AGGLOMERATE, OPTOELECTRONIC DEVICE AND METHODS FOR PRODUCING A STRUCTURE AND AN AGGLOMERATE

(71) Applicant: OSRAM Opto Semiconductors GmbH, Regensburg (DE)

(72) Inventors: Erik Johansson, Portland, OR (US); Robert Fitzmorris, Portland, OR (US); Kevin Wiese, Tualatin, OR (US); James Wyckoff, Portland, OR (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 404 days.

(21) Appl. No.: 17/530,543

(22) Filed: Nov. 19, 2021

(65) Prior Publication Data

US 2023/0163252 A1 May 25, 2023

(51) Int. Cl.
| H01L 33/50 | (2010.01) |
| H01L 25/16 | (2023.01) |
| H01L 33/00 | (2010.01) |
| H01L 33/54 | (2010.01) |
| H01L 33/56 | (2010.01) |

(52) U.S. Cl.
CPC .......... *H01L 33/504* (2013.01); *H01L 25/167* (2013.01); *H01L 33/005* (2013.01); *H01L 33/54* (2013.01); *H01L 33/56* (2013.01); *H01L 2933/0041* (2013.01); *H01L 2933/005* (2013.01)

(58) Field of Classification Search
None
See application file for complete search history.

(56) References Cited

U.S. PATENT DOCUMENTS

2019/0379001 A1 12/2019 Jung et al.

FOREIGN PATENT DOCUMENTS

KR    20210028912 A    3/2021

OTHER PUBLICATIONS

Machine-generated English translation of KR20210028912A (Year: 2021).*
International Search Report based on application No. PCT/EP2022/080929 (15 pages), dated Feb. 20, 2023 (reference purpose only).
Zhelev, Z., et al., "Single Quantum Dot-Micelles Coated with Silica Shell as Potentially Non-Cytotoxic Fluorescent Cell Tracers", Journal of the American Chemical Society, Apr. 21, 2006, pp. 6324-6325, vol. 128, issue 19.

(Continued)

*Primary Examiner* — Bo B Jang
(74) *Attorney, Agent, or Firm* — Viering, Jentschura & Partner mbB

(57) ABSTRACT

A structure comprising a nanoparticle converting electromagnetic radiation of a first wavelength into electromagnetic radiation of a second wavelength range, an interlayer at least partially surrounding the nanoparticle, and an encapsulation at least partially surrounding the interlayer is specified, wherein the interlayer comprises a plurality of first amphiphilic ligands and a plurality of second amphiphilic ligands and the first ligands and the second ligands are intercalated.

Furthermore, an agglomerate comprising a plurality of structures, an optoelectronic device as well as methods for producing a structure and an agglomerate are disclosed.

19 Claims, 8 Drawing Sheets

(56) References Cited

OTHER PUBLICATIONS

Zhelev, Z., et al., "Single Quantum Dot-Micelles Coated with Silica Shell as Potentially Non-Cytotoxic Fluorescent Cell Tracers", Supporting information, pp. S1-S6.

Rumiana Bakalova et al., "Silica-Shelled Single Quantum Dot Micelles as Imaging Probes with Dual or Multimodality", Analytical Chemistry, Aug. 15, 2006, pp. 5925-5932, vol. 78, No. 16.

Mohamed F. Foda et al., "Biocompatible and Highly Luminescent Near-Infrared $CuInS_2$/ZnS Quantum Dots Embedded Silica Beads for Cancer Cell Imaging", ACS Applied Materials & Interfaces 2014, Jan. 16, 2014, pp. 2011-2017, vol. 6, ACS Publications.

Xiaoge Hu et al., "Encapsulation of Single Quantum Dots with Mesoporous Silica", Annuals of Biomedical Engineering, Author manuscript, PMC 2010, Oct. 1, 2010, 12 pages, vol. 37, Issue 10, National Institutes of Health Public Access.

Yunfeng Lu et al., "Continuous formation of supported cubic and hexagonal mesoporous films by sol-gel dip-coating", Nature, Sep. 25, 1997, pp. 364-368, vol. 389, Macmillan Publishers Ltd 1997.

Linzhong Wu et al., "A general and facile approach to disperse hydrophobic nanocrystals in water with enhanced long-term stability", Journal of Materials Chemistry C, 2017, Feb. 28, 2017, pp. 3065-3071, vol. 5, Royal Society of Chemistry.

Xingyong Wu et al., "Immunofluorescent labeling of cancer marker Her2 and other cellular targets with semiconductor quantum dots", Nature Biotechnology, Jan. 2003, pp. 41-46, vol. 21, 2003 Nature Publishing Group.

\* cited by examiner

STRUCTURE, AGGLOMERATE, OPTOELECTRONIC DEVICE AND METHODS FOR PRODUCING A STRUCTURE AND AN AGGLOMERATE

TECHNICAL FIELD

A structure, an agglomerate and an optoelectronic device are specified. Furthermore, a method for producing a structure and a method for producing an agglomerate are specified.

BACKGROUND

It is desirable to have a structure with increased stability. In particular, an electromagnetic radiation converting structure with improved chemical stability is desired. It is also desired to have an agglomerate with improved performance, such as an agglomerate with improved chemical stability. Furthermore, it is desired to have an optoelectronic device having an increased efficiency, as well as a simple and efficient method for producing the desired structure and agglomerate.

SUMMARY

According to an embodiment, a structure is provided. In particular, the structure comprises a nanoparticle configured to convert electromagnetic radiation of a first wavelength range into electromagnetic radiation of a second wavelength range. In other words, the nanoparticles is configured to absorb electromagnetic radiation of the first wavelength range, converts the electromagnetic radiation of first wavelength range into the electromagnetic radiation of the second wavelength range, and emits the electromagnetic radiation of the second wavelength range. In a further embodiment, the second wavelength range is at least partially or completely, different from the first wavelength range. For example, the second wavelength range is in the visible or IR wavelength range. In a further embodiment, the second wavelength range is from 500 nanometers to 2000 nanometers, both inclusive. In a further embodiment, the second wavelength range is from 500 nanometers to 1000 nanometers, both inclusive.

In particular, a nanoparticle is a particle having a diameter of 1 nanometer up to 100 nanometers. Due to their size, nanoparticles consisting of distinct materials have different properties than a bulk material consisting of the same material. For example, the nanoparticle and the bulk material differ in properties, such as optical properties, conductivity, and melting point. The nanoparticle may be spherical, rod-shaped, or cuboid. A surface of the nanoparticle may be uniform or uneven.

For example, the nanoparticle comprises or consists of a semiconductor material. The semiconductor material may be, for example, a III-V compound semiconductor material or a II-VI compound semiconductor material.

A III-V compound semiconductor material comprises at least one element of group 13 of the periodic table, for example B, Al, Ga, In, and at least one element of group 15 of the periodic table, for example N, P, As. A II-VI compound semiconductor material comprises at least one element of group 2 or 12 of the periodic table, for example Zn, Cd, Mg, and at least one element of group 16 of the periodic table, for example O, S, Se, Te.

In a further embodiment, the nanoparticle comprises or consists of a sulfide or a selenide.

For example, the nanoparticle is a quantum dot comprising a core and at least one shell. The core and/or the shell comprise at least one semiconductor material. In a further embodiment, the core comprises a different semiconductor material than the shell. In particular, the shell is epitaxially grown onto the core. The quantum dot comprises, for example, further shells and/or layers. In a further embodiment, the quantum dot comprises a quantum well structure. For example, the nanoparticle is a core-shell quantum dot or a core-shell-shell quantum dot.

The nanoparticle, in particular the quantum dot, may have a diameter ranging from 2 nanometers to 20 nanometers, both inclusive.

According to an embodiment, the structure comprises an interlayer at least partially surrounding the nanoparticle, or completely surrounding the nanoparticle. In particular, the interlayer is arranged on a surface of the nanoparticle. In a further embodiment, the interlayer is in direct contact with the nanoparticle. The interlayer may be bound to the surface of the nanoparticle, for example, by covalent, coordinative, and/or ionic bonds.

According to an embodiment, the structure comprises an encapsulation at least partially surrounding the interlayer, or completely surrounds the interlayer. In particular, the encapsulation is in direct contact with the interlayer. It is possible that the encapsulation is bound to the interlayer, for example, by covalent, coordinative, and/or ionic bonds. In particular, the encapsulation reaches into the interlayer. This is for example the case if the encapsulation and the interlayer are covalently bound to each other.

The interlayer and the encapsulation are in particular designed to protect the nanoparticle from environmental influences. Advantageously, both elements prevent a degradation of the nanoparticle, for example by a reaction with water and/or oxygen.

In a further embodiment, the interlayer connects the nanoparticle and the encapsulation. In other words, the interlayer acts like an adhesive between the nanoparticle and the encapsulation. Furthermore, the presence of the interlayer enables a simple and efficient formation of the encapsulation. Advantageously, a structure and/or a composition of the nanoparticle, in particular the surface of the nanoparticle, is not damaged during formation of the encapsulation, due to the presence of the interlayer. With the aid of the interlayer, the encapsulation is only indirectly coupled to the nanoparticle.

According to an embodiment, the interlayer comprises a plurality of first amphiphilic ligands and a plurality of second amphiphilic ligands. An amphiphilic ligand comprises hydrophilic and hydrophobic moieties. In other words, the amphiphilic ligand comprises a polar moiety and a non-polar moiety. In particular, the amphiphilic ligand comprises a polar, hydrophilic head group and a non-polar, hydrophobic side chain.

In particular, the first ligands are native ligands. In other words, the first ligands are already arranged around the nanoparticle as a result of the manufacturing process of the nanoparticle.

According to an embodiment, the first ligands and the second ligands are intercalated. Intercalated in this context means that a first ligand is inserted into a plurality of second ligands and vice versa. In a further embodiment, at least one first ligand and at least one second ligand are in direct contact with each other. In particular, the first ligands and the second ligands are arranged alternatingly in the interlayer. The first ligands and the second ligands may be interdigitated.

In a further embodiment, the first ligands and the second ligands are intercalated in such a way that the non-polar, hydrophobic side chains of the first ligands and the non-polar, hydrophobic side chains of the second ligands are arranged adjacently. In this way the interlayer can have a structure wherein the head groups of the first ligands and the head groups of the second ligands are on opposite surfaces of the interlayer. For example, the second ligand is a surfactant.

According to a further embodiment, a structure is provided that comprises a nanoparticle configured to convert electromagnetic radiation of a first wavelength range into electromagnetic radiation of a second wavelength range, an interlayer at least partially surrounding the nanoparticle, and an encapsulation at least partially surrounding the interlayer. The interlayer comprises a plurality of first amphiphilic ligands and a plurality of second amphiphilic ligands and the first ligands and the second ligands are intercalated.

In particular, the encapsulation and the nanoparticle are not directly covalently linked together.

Advantageously, as the interlayer comprises the first ligands and the second ligands which are intercalated, the nanoparticle and the quantum dot are connected in a flexible manner. This means that even if there is mechanical stress, for example, by thermal expansion or thermal contraction the encapsulation and the nanoparticle remain intact. Due to the intercalated first and second ligands, the interlayer can act as a mechanical buffer layer and thus prevent a damage of the structure through expansion or contraction of either the nanoparticle or the encapsulation. In other words, a flexible attachment mechanism between the nanoparticle and the encapsulation is achieved by the interlayer.

According to an embodiment, the encapsulation has a thickness ranging from 10 nanometers to 100 nanometers both inclusive. In particular, with such a thickness of the encapsulation, the nanoparticle is efficiently protected from mechanical and/or chemical damage. Additionally or alternatively, the thickness of the encapsulation ensures that the encapsulation itself is mechanically stable.

According to an embodiment, the encapsulation comprises at least one of silica ($SiO_2$), alumina ($Al_2O_3$), titania ($TiO_2$), and combinations thereof. In particular, the encapsulation consists of at least one of these materials. The encapsulation may be formed from a network comprising at least one of these materials. In a further embodiment, the encapsulation comprises or consists of silica. Advantageously, the materials described for the encapsulation ensure that the encapsulation is mechanically and chemically stable and that the nanoparticle is effectively protected from mechanical or chemical damage.

According to an embodiment, the first ligand is bound to the nanoparticle by at least one bond chosen from the following group: covalent bond, ionic bond, coordinative bond, or combinations thereof. Additionally or alternatively, the first ligand is not bound to the encapsulation. Furthermore, it is possible that the first ligand is not in direct contact with the encapsulation. Due to the bond between the nanoparticle and the first ligand, the interlayer and thus the encapsulation can effectively adhere to the nanoparticle.

According to an embodiment, the second ligands is bound to the encapsulation by at least one bond chosen from the following group: covalent bond, ionic bond, coordinative bond, or combinations thereof. Additionally or alternatively, the second ligand is not bound to the nanoparticle. Furthermore, it is possible that the second ligand is not in direct contact with the nanoparticle. Due to the bond between the encapsulation and the second ligand, the interlayer and thus the nanoparticle can effectively adhere to the encapsulation.

In particular, the second ligand is covalently bound to the encapsulation. This means that, for example, the head group of the second ligand is part of the encapsulation. In other words, atoms of the head group of the second ligand may be integrated into the network of the encapsulation.

According to an embodiment, the first ligands and the second ligands interact through at least one of van der Waals forces, n-stacking (pi-stacking), covalent bonding, and combinations thereof. In particular, the interaction by van der Waals forces and n-stacking facilitates a flexible structure of the interlayer. This enables a compensation of the thermal expansion of the encapsulation. As a result, the stress on the nanoparticle is reduced and thus the efficiency of the structure is improved. This may be explained as stress applied on the nanoparticle can lead to a reduced ability of the nanoparticle to convert electromagnetic radiation of the first wavelength range into electromagnetic radiation of the second wavelength range.

In contrast, in common structures the encapsulation is inflexibly bound to the nanoparticle. This couples the encapsulation strongly to the nanoparticle. Thermally induced stress, like expansion or shrinkage, can lead in this case to damaging of the nanoparticle and/or the encapsulation. As an effect, an emission of light from the common structures may be decreased.

According to an embodiment, the first ligands and the second ligands are slidable to adjust for thermal expansion. In other words, the first ligands and the second ligands are movable with respect to each other. As a result, a size of the interlayer may be dependent on a temperature. Advantageously, a slipping of the first ligands and the second ligands leads to a more reliable structure as mechanical stress on the nanoparticle and/or the encapsulation due to temperature changes is compensated.

According to one embodiment, the first ligands and/or the second ligands comprise a polar head group. In a further embodiment, the first ligands and/or the second ligands comprise a head group selected from the group consisting of: phosphonic acids, carboxylic acids, primary amines, thiols, and their derivatives. In particular, phosphonic acids, carboxylic acids, primary amines and their derivatives form a coordinative bond to the encapsulation or the nanoparticle. In contrast, a thiol can form a covalent bond to the nanoparticle. In other words, the head group of the first ligand and the second ligand act as an anchor group in case of the first ligand to the nanoparticle and in case of the second ligand to the encapsulation. In particular, the head group of the first ligand and the head group of the second ligand are different. Alternatively, the head group of the first ligand and the head group of the second ligand are the same. For example, the head group of the first ligand and the head group of the second ligand are a phosphonic acid or a phosphonic acid derivative such as a phosphonate. In particular, phosphonates strongly bind to the nanoparticle and an encapsulation that comprises titania.

According to an embodiment, the first ligand and/or the second ligand comprise a non-polar side chain. Such a non-polar side chain may comprise or consist of at least one of an alkyl chain, an alkenyl chain or an alkynyl chain. The side chain may be linear or branched. Additionally or alternatively, the side chain may be functionalized. In particular, the side chain may be at least partially, in particular completely halogenated, for example fluorinated and/or chlorinated. For example, the non-polar side chain is a perfluorinated alkyl chain. For example, the first ligand is oleic acid, oleylamine, or an oleic acid derivative.

A length of the side chain may be important for the properties of the interlayer. For example, chemical properties of the interlayer are controlled by the length of the side chain. In particular, if the length of the side chain is increased, a barrier to water diffusion to and from the nanoparticle may be reduced. Alternatively, if the length of the side chain is decreased, the barrier to water diffusion may be enhanced. In other words, the barrier to water diffusion may be controlled by simply controlling an average thickness of the side chains of the first ligand and the second ligand.

According to an embodiment, the non-polar side chain comprises a spacer group, an aromatic group, and a terminal group.

In particular, the spacer group is directly, covalently bound to the head group. The spacer group may be a branched or linear alkyl chain or a branched or linear alkenyl chain. In a further embodiment, the spacer group is a linear alkyl chain or a linear alkenyl chain. The linear alkyl chain may only comprise methylene units (—$CH_2$—). Alternatively, the spacer group may be functionalized. In this regard, the spacer group may comprise a vinyl halide or a ketone.

In a further embodiment, the spacer group of the first ligand has a chain length (w) of 2 to 12 carbon atoms. The spacer group of the second ligand can have a chain length (y) of 2 to 12 carbon atoms. The spacer group of the first ligand and the second ligand may be the same or different.

In particular, the aromatic group comprises an aromatic ring system with at least one of a benzene, a pyridine, an indene, a naphthalene, and an anthracene. The aromatic group may be directly, covalently bound to the spacer group. The aromatic ring system can have a variety of independently selected substituents selected from the group consisting of hydrogen (—H), halogens (—X), linear or branched, substituted or unsubstituted alkanes, linear or branched, substituted or unsubstituted alkenes, alkynes, nitrile (—CN), ketones, and aldehydes. The aromatic group of the first ligand and the second ligand may be the same or different.

In particular, the terminal group is directly, covalently bound to the aromatic group. The terminal group may be a branched or linear alkyl chain or a branched or linear alkenyl chain. In a further embodiment, the terminal group is a linear alkyl chain or a linear alkenyl chain. The linear alkyl chain may only comprise methylene units (—$CH_2$—). Alternatively, the terminal group may be functionalized. In this regard, the terminal group may comprise a vinyl halide or a ketone.

In a further embodiment, the terminal group of the first ligand has a chain length (z) of 2 to 12 carbon atoms. The terminal group of the second ligand can have a chain length (x) of 2 to 12 carbon atoms. The spacer group of the first ligand and the second ligand may be the same or different.

In a further embodiment, the chain length (z) of the terminal group of the first ligand is the same as the chain length (y) of the spacer group of the second ligand. The chain length (w) of the spacer group of the first ligand may be the same as the chain length (x) of the terminal group of the second ligand.

According to a further embodiment, the first ligand and/or the second ligand comprises a polar head group and a non-polar side chain, the non-polar side chain comprises a spacer group, an aromatic group, and a terminal group, and the spacer group in the terminal group comprises an alkyl chain or an alkenyl chain.

By using the first ligand and the second ligand comprising a non-polar side chain with an aromatic group, the first ligand and the second ligand can interact not only through van der Waals forces but also through n-stacking. As a result, a chain length of the side chain may be decreased while an intensity of an interaction between the first ligand and the second ligand remains the same. In other words, the use of first ligand and the second ligand comprising an aromatic group in the side chain of allows for shorter ligands compared to common ligands that only interact through van der Waals forces.

In particular, the size of the interlayer may be adjusted by selecting distinct chain lengths of the spacer group and the terminal group of the first ligand and the second ligand. By selecting the distinct chain lengths, a position of the aromatic group in the first ligand and the second ligand may be set. As the n-stacking is a stronger interaction than the van der Waals forces, the position of the aromatic group in the first ligand and the second ligand determines the thickness of the interlayer or in other words a distance of the nanoparticle and the encapsulation.

For example, the first ligand has the following structural formula:

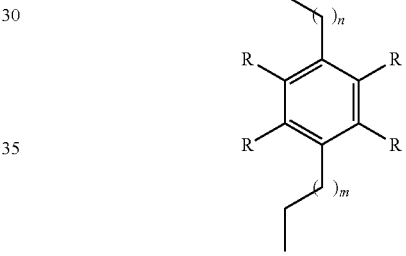

where n is an integer ranging from 1 to 11 and m is an integer ranging from 0 to 8. For example, n is 2, 5, or 11.

For example, m is 1 or 2. Each R may be independently selected from the group consisting of hydrogen (—H), halogens (—X), linear or branched, substituted or unsubstituted alkanes, linear or branched, substituted or unsubstituted alkenes, alkynes, nitrile (—CN), ketones, and aldehydes.

According to an embodiment, the second ligand is a polymer. In particular, the polymer comprises a polar backbone and a plurality of non-polar side chains. The polar backbone comprises, for example, a plurality of polar head groups. The non-polar side chains may comprise a structure as described herein. The polar head groups is, for example, selected from the group consisting of: phosphonic acids, carboxylic acids, primary amines, and their derivatives.

In particular, the second ligand as a polymer enables a fast assembly of the interlayer. This may be explained as a polymeric second ligand has a higher degree of pre-organization compared to common non-polymeric second ligands. Additionally, an interaction of the polymeric second ligand and the encapsulation may be increased compared to a common non-polymeric second ligand. Furthermore, the polymeric second ligand has an enhanced affinity for the first ligands.

According to an embodiment, the side chain of the first ligand and/or the second ligand comprises a reactive group.

In particular, the spacer group or the terminal group of the side chain comprises the reactive group. "Reactive group" means in this context that this group is able to undergo a chemical reaction with another reactive group. A reactive group is, for example, a vinyl halide, a ketone or another group that can form a covalent bond bridge between the first ligand and the second ligand. For example, a covalent bridge may be in the form of an alkene, a disulfide, an amide, an enamine, an ether, a thioether, an ester, or a bridging carbon-carbon bond. Ketones of adjacent ligands, for example adjacent first ligands and second ligands, can undergo a base-catalyzed aldol condensation. Vinyl halides of adjacent ligands, for example adjacent first ligands and second ligands, can undergo oligomerization, for example dimerization, or polymerization.

If two reactive groups of adjacent ligands react with each other a covalent bond may be formed between the two ligands. This enables a more stable interlayer. Additionally or alternatively, a network within the interlayer may be formed preventing degrading substance to reach the nanoparticle. Thus, the light-conversion efficiency of the nanoparticle may be increased.

According to an embodiment, the interlayer comprises at least one additive chosen from the group consisting of: additional ligands, quantum dots, growth reagents, reducing agents, lubricants, plasticizers. In other words, the interlayer may be used for storage of beneficial chemical moieties.

In particular, the additional ligands, quantum dots, growth reagents, and reducing agents can act as regenerative species for the nanoparticle and the encapsulation. This means that damages to the nanoparticle and the encapsulation, for example, generated by thermal, mechanical, and/or chemical stress may be remedied.

For example, the growth reagent is a II-IV compound semiconductor material growth reagent such as zinc oleate or a chalcogen source, for example thioacetamide. A reducing agent may be a borohydride species.

The lubricants and the plasticizers improve a flexibility of the interlayer. In particular, the first ligands and the second ligands are prevented from being detached under mechanical stress with the aid of the lubricants and the plasticizers. For example, phthalates, organophosphates, and bisphenol A may be used to improve the flexibility of the interlayer.

Furthermore, an agglomerate is specified. In a further embodiment, the agglomerate comprises a plurality of structures as described herein. Thus, features and embodiments described in connection with the structure also apply to the agglomerate and vice versa.

According to an embodiment, the agglomerate comprises a plurality of structures. The structures are, for example, agglomerated with each other by covalent bonding, coordinative bonding, or both of covalent and coordinative bonding. In particular, the structures are agglomerated with each other by covalent bonding. In other words, the structures within the agglomerate are linked by covalent bonds. For example, the encapsulation of the structures are covalently bound together. Advantageously, the agglomerate is more stable with regards to thermal, mechanical and chemical stress compared to a single structure. Furthermore, electromagnetic radiation conversion properties of the agglomerate may be improved compared to a single structure.

According to an embodiment, the agglomerate comprises a diameter of 0.5 micrometers to 10 micrometers, both inclusive. The diameter of the agglomerate may be at least 1 micrometer. In a further embodiment, the diameter of the agglomerate ranges from 5 micrometers to 10 micrometers, both inclusive. Due to its size, the agglomerate is easier to handle compared to single structures. In particular, the agglomerate is easier to separate from other particles due to the size.

According to an embodiment, the agglomerate is further encapsulated. In particular, the further encapsulation comprises the same features as described in combination with the encapsulation within the structure. The further encapsulation may comprise or consist of the same material as the encapsulation of the structure. Alternatively, the further encapsulation of the agglomerate comprises or consists of a different material compared to the encapsulation of the structure.

In particular, a plurality of agglomerates forms a superstructure by further agglomeration. For example, a size of the superstructure is at most 10 micrometers.

An optoelectronic device is specified. In particular, the optoelectronic device comprises a structure and/or an agglomerate as described herein. Thus, features and embodiments disclosed in combination with the structure and the agglomerate can also apply to the optoelectronic device and vice versa.

According to an embodiment, the optoelectronic device comprises a semiconductor chip. The semiconductor chip comprises an epitaxially grown semiconductor layer sequence configured to emit electromagnetic radiation of a first wavelength range. For example, the first wavelength range is the UV to blue wavelength range of the visible electromagnetic radiation. For example, the semiconductor chip is a light emitting diode chip or a laser diode chip.

In particular, the semiconductor layer sequence comprises an active region that emits the electromagnetic radiation of the first wavelength range. The electromagnetic radiation of the first wavelength range is, for example, emitted through a radiation exit surface of the semiconductor chip.

According to an embodiment, the optoelectronic device comprises a conversion layer. In a further embodiment, the conversion layer comprises at least one structure or at least one agglomerate as described herein. In particular, the conversion element is designed or configured to convert the electromagnetic radiation of the first wavelength range into electromagnetic radiation of a second wavelength range. In a further embodiment, the second wavelength range is at least partially, or completely, different from the first wavelength range. For example, the second wavelength range is in the visible or IR wavelength range. In a further embodiment, the second wavelength range is from 500 nanometers and 2000 nanometers, both inclusive. According to a further embodiment, the second wavelength range is from 500 nanometers and 1000 nanometers, both inclusive.

In particular, the conversion element comprises a plurality of structures or a plurality of agglomerates. The features and embodiments of the structure and the agglomerate have already been disclosed in conjunction with the structure and the agglomerate and also apply to the structures and agglomerates in the optoelectronic device.

In a further embodiment, the conversion element comprises a plurality of structures or a plurality of agglomerates. The structures or the agglomerates may be deposited in a matrix material, such as an epoxy, a polyurethane or a polysiloxane. Alternatively, the conversion element may be free of a matrix material.

For example, the optoelectronic device described herein emits white light or colored light. The structures and the agglomerate in the conversion element have an enhanced stability in environmentally challenging conditions such as high humidity and high temperature due their structure, in particular the structure of the interlayer. Thus, the optoelectronic device described here has an increased operating lifetime even under corrosive conditions and increased temperatures.

A method for producing a structure is specified. In particular, the method is used to produce a structure as described herein. Thus, features and embodiments described in conjunction with the structure also apply to the method for producing a structure and vice versa.

According to an embodiment of the method a nanoparticle is provided. In particular, the nanoparticle converts electromagnetic radiation of a first wavelength range into electromagnetic radiation of a second wavelength range. The nanoparticle may comprise a plurality of amphiphilic first ligands on a surface. In a further embodiment, the nanoparticle and the first ligands have features as described herein. Thus, the described features also apply to the nanoparticle and the first ligands.

In particular, the first ligands on the surface of the nanoparticle result from the method of manufacturing of the nanoparticle.

According to an embodiment, an interlayer is formed around the nanoparticle by adding a plurality of amphiphilic second ligands to the nanoparticle. In particular, the interlayer comprises the first ligands and the second ligands. The first ligands and the second ligands may be intercalated. In a further embodiment, the second ligand and the interlayer have features as described herein. Thus, the described features also apply to the second ligand and the interlayer.

According to an embodiment, an encapsulation is formed around the interlayer. In a further embodiment, the encapsulation has features as described herein. Thus, the described features also apply to the encapsulation.

According to a further embodiment, the method for producing a structure comprises the following:
  providing a nanoparticle configured to convert electromagnetic radiation of a first wavelength range into electromagnetic radiation of a second wavelength range, said nanoparticle comprising a plurality of amphiphilic first ligands on a surface,
  forming an interlayer at least partially around the nanoparticle by adding a plurality of amphiphilic second ligand to the nanoparticle, wherein the interlayer comprises the first ligands and the second ligands and wherein the first ligands and the second ligands are intercalated,
  forming an encapsulation at least partially around the interlayer.

In a further embodiment, the method steps are carried out in the described order. In particular, a plurality of nanoparticles is provided and thus a plurality of structures may be produced.

The method described herein allows an efficient and reliable production of structures. Compared to common methods, it is not necessary to exchange the native ligands of the nanoparticle before forming the encapsulation. This reduces the need of additional, time-consuming method steps. Furthermore, the production of the structures is more resource-friendly. As the native ligands are never removed during the method for producing structure, the surface of the nanoparticle is not damaged. In contrast, during common methods this is however the case. As a result, method steps of the common method solely aiming at recovering lost optical performance are no longer needed and can thus be omitted completely or at least reduced in scope in the presently described method.

Advantageously, nanoparticles requiring specific ligand coatings to maintain their optical properties, like the conversion of electromagnetic radiation, may be used in the method for producing a structure. In contrast, in common methods such nanoparticles may not be applied. This enables the production of structures comprising nanoparticles, and an encapsulation having nanoparticles, which are sensitive to common protection schemes.

It is further possible that, due to the interlayer, harsher processes and processes for ultimately more stable encapsulations may be used during forming the encapsulation without damaging the nanoparticle. In common methods, this is currently not possible or only doable with a lot of effort, for example by using additional method steps. For example, without the use of the interlayer, the nanoparticle may degrade during forming of the encapsulation. A degradation in the common methods for producing a structure, in particular methods without a formation of an interlayer, results from contact between the surface of the nanoparticle and the reagents used to form the encapsulation.

According to an embodiment, the second ligand comprises a reactive head group comprising a $SiR_3$ group, wherein each R is independently selected from the group comprising hydrogen (H), methoxy (OMe), ethoxy (OEt), iso-propoxy (OiPr), chlorine (Cl), bromine (Br). In a further embodiment, R is methoxy or ethoxy. In other words, the second ligand may comprise a reactive head group comprising $Si(OMe)_3$ or $Si(OEt)_3$.

For example, the second ligand comprises the following structural formula:

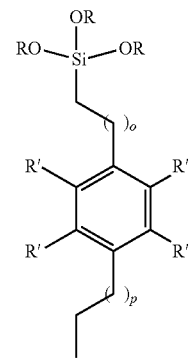

wherein o is an integer ranging from 1 to 11 and p is an integer ranging from 0 to 8. For example, o and/or p is each, independently, 1 or 2. Each R' may be independently selected from the group consisting of hydrogen (—H), halogens (—X), linear or branched, substituted or unsubstituted alkanes, linear or branched, substituted or unsubstituted alkenes, alkynes, nitrile (—CN), ketones, and aldehydes. In a further embodiment, R is methyl (Me) or ethyl (Et).

During forming the encapsulation, the reactive head group can change its composition and may be integrated in the encapsulation. As a result, an encapsulation may be formed which is covalently bound to the second ligands. For example, the head group of the second ligand in the finished structure comprises then a silicon atom bound to a network of the encapsulation. This may be explained as during forming the encapsulation, the R groups of the $SiR_3$ group of the head group of the second ligand are exchanged. In other words, after the encapsulation is formed around the interlayer, each R may be $(SiO_2)_x$ if the encapsulation comprises or consists of silica.

According to an embodiment, the encapsulation comprises silica and forming the encapsulation around the interlayer comprises growing the silica using a reverse micelle method. In particular, a reverse micelle method is a method wherein a reverse micelle is formed, in which a reaction takes place.

In the present case, the reaction is the formation of the encapsulation. In particular, a surfactant is used during the reverse micelle method.

Due to the use of the reverse micelle method, the growth of the silica and thus the formation of the encapsulation may be controlled in an advantageous manner. In particular, the surfactant used in the reverse micelle method prevents nucleation, growth and agglomeration of particles, such as the structures formed in the method.

According to an embodiment, the encapsulation comprises silica and forming the encapsulation around the interlayer comprises treating with an alkoxy silane. In particular, the alkoxy silane is tetraethyl orthosilicate ($Si(OEt)_4$, TEOS). In a further embodiment, treating with an alkoxy silane may be repeated at least once or twice.

The use of the alkoxy silane, in particular TEOS, enables an efficient and selective formation of the encapsulation at least partially or fully around the interlayer by forming silica through hydrolysis. The alkoxy silane may be dosed easily and precisely as it is a liquid compound.

According to an embodiment, after forming the interlayer, the nanoparticle at least partially or fully surrounded by the interlayer is dispersed in a polar solvent to form a first solution. The polar solvent may be an alcohol, deionized water, and combinations thereof. For example, ethanol, methanol, isopropanol, and mixtures thereof may be used as the polar solvent.

In particular, the first solution is added to a second solution. The second solution may comprise a non-polar solvent and a surfactant. By adding the first solution to the second solution, a third solution is formed. The non-polar solvent may comprise or consist of toluene, hexane, chloroform, and combinations thereof. A surfactant is, for example, selected from the group consisting of an anionic surfactant, a cationic surfactant, a nonionic surfactant, an amphoteric surfactant, and combinations thereof. An anionic surfactant is, for example, sodium dodecyl sulfate (SDS). Cetyltrimethylammonium bromide (CTAB) is an example of a cationic surfactant. A nonionic surfactant is, for example Triton-X or N,N-bis(2-hydroxyethyl)dodecanamide. An alkyl betaine may be used as the amphoteric surfactant.

Alternatively, after forming the interlayer, the nanoparticle surrounded by the interlayer is added to the second solution without dispersing in a polar solvent to form a first solution. In other words, the nanoparticle at least partially or fully surrounded by the interlayer is added in dry form to the second solution.

In a further embodiment, forming the encapsulation around the interlayer comprises adding at least one of a silica source, water, an acid, a base, and combinations thereof to the third solution. In a further embodiment, a silica source is a precursor compound from which silica may be formed. For example, alkoxy silanes, such as TEOS, are silica sources. Alkali hydroxides, such as KOH, may be used as a base.

By adding the first solution to the second solution and forming the encapsulation around the interlayer as described above, the encapsulation is formed in a selective and effective manner. In particular, a thickness, a composition, and a structure of the encapsulation may be regulated efficiently by tuning the combination of reactants used in the formation of the encapsulation. Furthermore, an agglomeration of the formed structure may be prevented using this method.

According to an embodiment, the nanoparticle with the plurality of first ligands is provided in a first solvent. The first solvent is, for example, a non-polar solvent such as toluene, hexane, or chloroform. In particular, the plurality of second ligands is added to the nanoparticle with the plurality of first ligands in the first solvent. The plurality of second ligands may be added as a solution to the nanoparticle with the first ligands in the first solvent or in substance that is without an additional solvent. The addition of the second ligands to the nanoparticle in the first solvent may lead to the formation of the interlayer.

According to an embodiment, the first solvent is removed after the addition of the plurality of second ligands and the nanoparticle is transferred to a second solvent after the first solvent is removed. In particular, the first solvent is a less polar solvent than the second solvent. The second solvent is, for example, a polar solvent like methanol, ethanol, isopropanol, deionized water, and mixtures thereof.

A removal of the first solvent may lead to the formation of a film of the nanoparticle surrounded by the interlayer and an excess of the second nanoparticle. In a further embodiment, the first solvent is removed by evaporation. For example, the first solvent is removed completely to give a dry film of the nanoparticle and the second ligand. The nanoparticle may be transferred to the second solvent by addition of the second solvent and resuspension of the nanoparticle surrounded by the interlayer in the second solvent.

According to an embodiment, the nanoparticle is transferred to the second solvent by stirring of a biphasic system after the addition of the plurality of second ligands. In particular, the first solvent is a less polar solvent than the second solvent. In a further embodiment, the first solvent and the second solvent are immiscible. With such a procedure, the removal of the first solvent, for example by evaporation, may be omitted. As a result, the nanoparticles surrounded by the interlayer are submitted to less stress.

According to an embodiment, the plurality of second ligands is added in an excess and the excess of the second ligands is removed. The addition of the second ligands in excess ensures an effective intercalation of the second ligands between the first ligands. Thus, the interlayer is built efficiently. Excess in this context means an excess of a number of the second ligands compared to a number of the first ligands. In particular, the second ligand is used in at least thousand fold excess.

According to an embodiment, the excess of the second ligands is removed by precipitation and resuspension cycles using the second solvent and a third solvent. For example, two or more precipitation and resuspension cycles are performed. In particular, the second solvent is a polar solvent and the third solvent is an anti-solvent to the second solvent. Anti-solvent in this context means that the second solvent and the third solvent are not miscible, i.e. immiscible. For example, the third solvent is a non-polar solvent like hexane, toluene, or chloroform. The first and the third solvent may be the same or different solvents.

In particular, a solubility of the nanoparticle surrounded by the interlayer is strongly reduced by an addition of the third solvent to the nanoparticle surrounded by the interlayer in the second solvent. As a result, the nanoparticles surrounded by the interlayer precipitate; whereas, the excess of the second ligand stays in solution. The solution comprising the second ligands may be removed from the precipitated nanoparticles. The process may be repeated to completely remove the excess of the second ligands such that a concentration of a free second ligand in a solution of the nanoparticle surrounded by the interlayer is low. Free second ligand in this context means that the second ligand is not intercalated in between the first ligands. In other words, a free second ligand is not part of the interlayer surrounding the nanoparticle.

According to an embodiment, the nanoparticle surrounded by the interlayer is dispersed in the second solvent. In particular, this is done after the excess of the second ligand is removed. Forming the encapsulation around the interlayer is then performed with the nanoparticle surrounded by the interlayer in the second solvent. In particular, the nanoparticle surrounded by the interlayer in the second solvent forms the first solution.

According to an embodiment, the nanoparticle surrounded by the interlayer in the second solvent is treated with a metal oxide precursor such as an alkyl silicate ($Si(OR)_4$), an alkyl aluminate ($Al(OR)_3$), an alkyl titanate ($Ti(OR)_4$), and combinations thereof. Additionally, catalysts, other reactants, and reagents may be added to form the encapsulation.

A method for producing an agglomerate is specified. In particular, the method may be used to produce an agglomerate as described herein. Thus, features and embodiments described in conjunction with the agglomerate also apply to the method for producing an agglomerate and vice versa.

According to an embodiment, the method for producing an agglomerate comprises providing a plurality of structures in a solvent and agglomeration of the plurality of structures by at least one of adding an anti-solvent, adding a salt, removing the solvent, and combinations thereof. The salt used may be selected from the group consisting of alkali halides, alkali acetates, and combinations thereof.

According to an embodiment, the method comprises forming a further encapsulation around the agglomerate. The further encapsulation may comprise the same or a similar composition as the encapsulation of the structures within the agglomerate. Thus, features and embodiments described in conjunction with the encapsulation and forming the encapsulation in the structure also apply to the further encapsulation around the agglomerate.

BRIEF DESCRIPTION OF THE DRAWINGS

Advantageous embodiments and developments of the structure, the agglomerate, the optoelectronic device, the method for producing a structure and the method for producing an agglomerate will become apparent from the exemplary embodiments described below in conjunction with the Figures.

In the Figures.

In the exemplary embodiments and Figures, similar or similarly acting constituent parts are provided with the same reference symbols. The elements illustrated in the Figures and their size relationships among one another should not be regarded as true to scale. Rather, individual elements may be represented with an exaggerated size for the sake of better representability and/or for the sake of better understanding.

DETAILED DESCRIPTION

Figure 1:
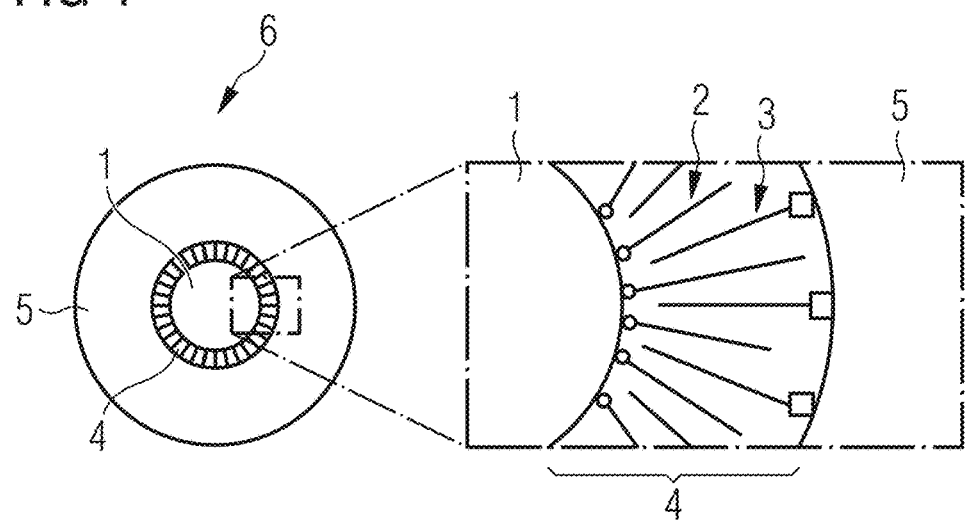
FIG. 1 shows a schematic cross section of a structure according to an exemplary embodiment.

In FIG. 1 an exemplary embodiment of a structure 6 described herein is shown. The structure 6 comprises a nanoparticle 1 which is surrounded by an interlayer 4 and an encapsulation 5. In particular, the encapsulation 5 comprises or consists of silica, alumina, titania, and combinations thereof. In a further embodiment, the encapsulation 5 consists of silica. The nanoparticle 1 comprises or consists of at least one semiconductor material, for example CdS or CdSe. The nanoparticle 1 may comprise a core and at least one shell. In a further embodiment, the nanoparticle 1 is a core-shell-shell quantum dot comprising a core with CdSe, a first shell with CdS and a second shell with ZnS.

The nanoparticle 1 may convert electromagnetic radiation of a first wavelength range into electromagnetic radiation of a second wavelength range. Thus, the structure 6 is configured to convert electromagnetic radiation of the first wavelength range into electromagnetic radiation of the second wavelength range. In other words, the structure 6 has wavelength converting properties. The second wavelength range is from 500 nanometers and 1000 nanometers, both inclusive. The first wavelength range is in the UV to blue region of the electromagnetic radiation.

The encapsulation 5 is indirectly coupled to the nanoparticle 1 with the aid of the interlayer 4. The interlayer 4 is arranged between the nanoparticle 1 and the encapsulation 5. The interlayer comprises a plurality of first ligands 2 and a plurality of second ligands 3. The first ligands 2 are so-called native ligands which arise from the production process of the nanoparticle 1. The second ligands 3 are intercalated into the plurality of first ligands 2.

Figure 2:
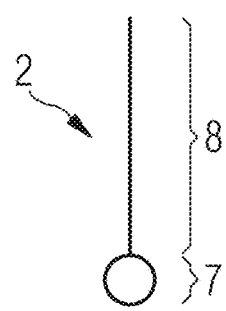
FIGS. 2 and 6 each show a schematic representation of a first ligand.
Figure 3:
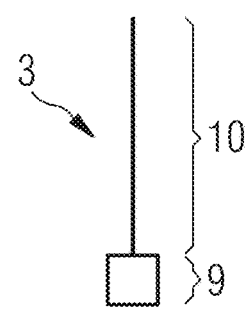
FIGS. 3, 4, and 7 each show a schematic representation of a second ligand.

A schematic structure of the first ligand 2 and the second ligand 3 is shown in FIGS. 2 and 3. The first ligand 2 comprises a head group 7 and a side chain 8. In a further embodiment, the head group 8 is a polar head group, in particular a phosphonate or a carboxylate. The second ligand 3 comprises a polar head group 9 and a non-polar side chain 10. The head group 7, 9 is covalently bound to the side chain 8, 10.

Referring again to FIG. 1, a magnification shows the structure of the interlayer 4 in more detail. The first ligands 2 are covalently, coordinatively, or both covalently and coordinatively bound to a surface of the nanoparticle 1. In particular, the head group 7 of the first ligand 2 is at least coordinatively bound to the nanoparticle 1. The side chain 8 points away from of the nanoparticle 1 into the direction of the encapsulation 5. The second ligands 3 are arranged such that the side chain 10 points in the direction of the nanoparticle 1. The side chain 8 of the first ligand 2 and the side chain 10 of the second ligand 3 and thus also the first ligand 2 and the second ligand 3 interact through at least one of van der Waals forces, n-stacking, covalent bonding, and combinations thereof. In particular, if the side chains 8 and 9 comprise alkyl chains, the first ligand 2 and the second ligand 3 interact mainly through van der Waals forces. The head group 9 of the second ligand 3 is oriented away from the nanoparticle 1 and is adjacent to the encapsulation 5. In particular, the head group 9 is covalently, coordinatively, or both covalently and coordinatively bound to the encapsulation 5. Additionally or alternatively, the head group 9 is bound by an ionic bond to the encapsulation 5. In the case that the head group is covalently bound to the encapsulation and that the encapsulation comprises silica, the head group may contain at least one silicon atom.

The interlayer 4 may comprise additives (not shown) like ligands, quantum dots, growth reagents, reducing agent, lubricants, plasticizers, and combinations thereof. These compounds may be arranged in between the non-polar side chains 10, 8 of the first ligands 2 and the second ligands 3.

Figure 4:
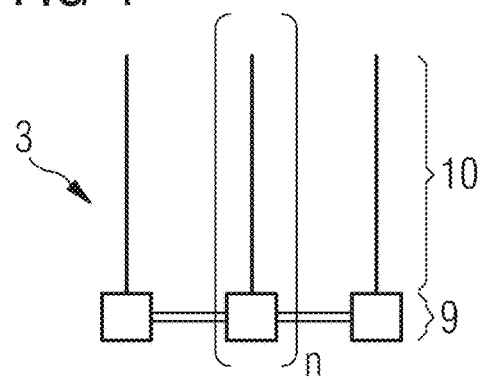

Alternatively, to the structure of the second ligand 3 shown in FIG. 3, the second ligand 3 may also have a structure as shown in FIG. 4. In this case, the second ligand 3 is a polymer. The polymeric second ligand comprises a polar backbone comprising a plurality of head groups 9. Furthermore, the polymeric second ligand 3 comprises a plurality of side chains 10 covalently bound to the backbone. In other words, the polymeric second ligand 3 comprises a plurality of subunits consisting of one polar head group 9 and one side chain 10 which are covalently linked together. An advantage of a polymeric second ligand 3 is that the polymeric second ligand 3 associates more strongly compared to its corresponding monomer.

Figure 5:
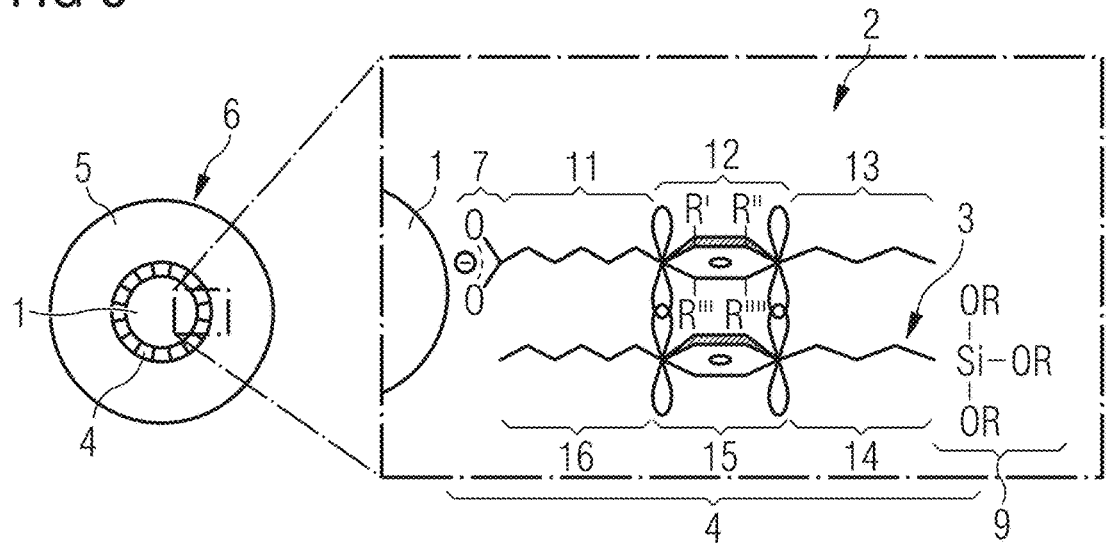
FIG. 5 shows a schematic cross section of a structure according to an exemplary embodiment.

In FIG. 5 an exemplary embodiment of a structure 6 is shown which comprises first ligands 2 and second ligands 3 having an aromatic group 12, 15. The present structure 6 comprises a nanoparticle 1, an interlayer 4 and an encapsulation 5. The interlayer 4 is arranged between the nanoparticle 1 and the encapsulation 5 and comprises the first ligands 2 and the second ligands 3. The detailed structure of the first ligand 2 and the second ligand 3 may be seen in the magnification of FIG. 5, which shows a section of the interlayer 4.

The first ligand 2 comprises a head group 7 which is presently a carboxylate, a spacer group 11 which is presently an alkyl chain with five methylene units, an aromatic group 12 which is a substituted phenyl ring, and a terminal group 13 which is an alkyl chain with four carbon atoms. The aromatic group 12 comprises substituents R', R'', R''', R'''' which are independently selected from the following group: a hydrogen atom, a halogen atom, an alkane group, an alkene group, an alkyne group, a nitrile, a ketone, an aldehyde.

The second ligand 3 comprises a head group 9, a spacer group 14 which is an alkyl chain having three methylene units, an aromatic group 15, and a terminal group 16 with an alkyl chain comprising six carbon atoms. The aromatic group 15 is a substituted phenyl ring. The head group 9 comprises a silicon atom which is covalently bound to the alkyl chain of the spacer group 14. Three oxygen atoms are further bound to the silicon atom of the head group 9. Through the oxygen atoms, the second ligand 3 is covalently bound to the encapsulation 5. In other words, the head group 9 of the second ligand 3 is integrated into a network of a material of the encapsulation 5. In this case, each R in the Si(OR)$_3$ group is (SiO$_2$)$_x$.

During production of the structure 6, Si(OR)$_3$ in the head group 9 of the second ligand 3 may have a different composition. In particular, the R groups may have been methyl (Me) or ethyl (Et).

For representing the interaction between the first ligand 2 and the second ligand 3, two orbital lobes for each aromatic group 12, 15 are shown. The orbital lobes of the first ligand 2 and the orbital lobes of the second ligand 3 interact with each other. This phenomenon is also called n-stacking.

Figure 6:
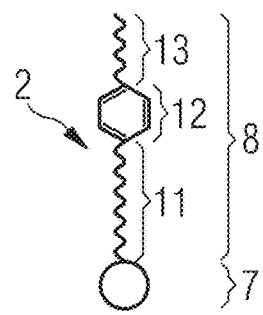

FIG. 6 shows a schematic representation of a first ligand 2. The first ligand 2 comprises presently a head group 7 and a side chain 8. The head group 7 may be selected from the group comprising phosphonic acids, carboxylic acids, primary amines, thiols, and derivatives thereof.

The side chain 8 is divided in three parts: a spacer group 11, an aromatic group 12, and a terminal group 13. The spacer group 11 may be an alkyl chain, an alkene chain, or an alkyne chain, which is covalently bound to the head group 7. In particular, the spacer group 11 is linear; however, it is also possible that the spacer group 11 is branched. The spacer group 11 may also be at least partially fluorinated.

The aromatic group 12 is covalently bound to the spacer group 11 and the terminal group 13. The aromatic group 12 is presently a phenyl ring. In other words, the aromatic group 12 is a benzene derivative. Alternatively, it is also possible that the aromatic group 12 is a pyridine, an indene, a naphthalene, or an anthracene. The aromatic group 12 may be further substituted.

The terminal group 13 may be an alkene chain, or an alkyne chain, which is covalently bound to the aromatic group 12. In particular, the terminal group 13 is linear; however, it is also possible that the terminal group 13 is branched. The terminal group 13 may also be at least partially fluorinated.

Figure 7:
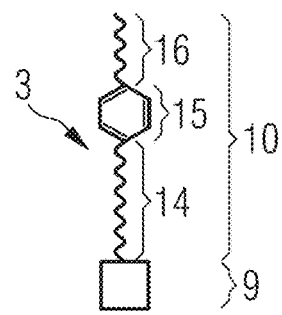

FIG. 7 shows a schematic representation of a second ligand 3. The second ligand 3 comprises a head group 9 and a side chain 10. The head group 9 may be integrated into a network of an encapsulation 5. However, it is also possible that the head group 9 is selected from the group comprising phosphonic acids, carboxylic acids, primary amines, thiols, and derivatives thereof.

The side chain 10 comprises presently a spacer group 14, and aromatic group 15, and a terminal group 16. The spacer group 14 is covalently bound to the head group 7. In particular, the spacer group 14 is an alkyl chain, an alkene chain, or an alkyne chain, which is covalently bound to the head group 7.

In particular, the spacer group 14 is linear; however, it is also possible that the spacer group 14 is branched. The spacer group 14 may also be at least partially fluorinated.

The aromatic group 15 is covalently bound to the spacer group 14 and the terminal group 16. The aromatic group 15 is presently shown as a phenyl ring. In other words, the aromatic group 15 is a benzene derivative. Alternatively, it is also possible that the aromatic group is a pyridine, an indene, a naphthalene, or an anthracene. The aromatic group 15 may be further substituted.

The terminal group 16 may be an alkene chain, or an alkyne chain, which is covalently bound to the aromatic group 15. In particular, the terminal group 16 is linear; however, it is also possible that the terminal group 16 is branched. The terminal group 16 may also be at least partially fluorinated.

Figure 8:
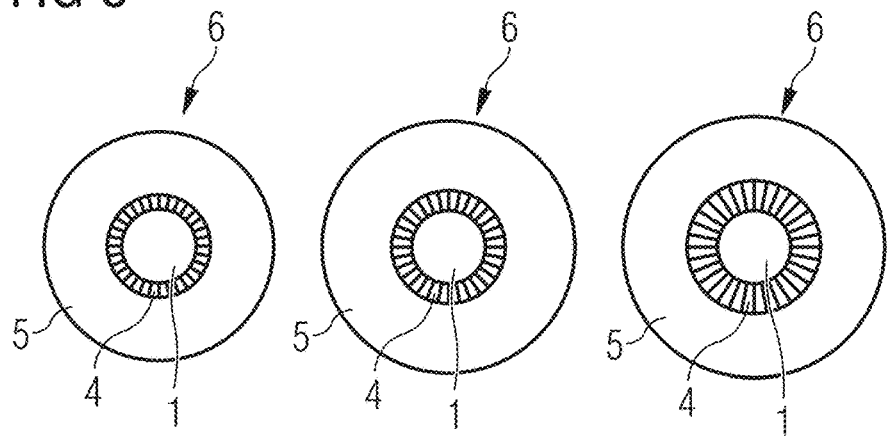
FIG. 8 shows three schematic representations of a structure each according to an exemplary embodiment.

FIG. 8 shows three structures 6 each according to an exemplary embodiment. Each structure 6 comprises a nanoparticle 1 surrounded by an interlayer 4 and an encapsulation 5. The interlayer 4 is arranged between the nanoparticle 1 and the encapsulation 5. Each of the shown structures 6 has an interlayer 4 with a different thickness. In FIG. 8, the thickness of the interlayer 4 increases from left to right. In other words, the structures 6 on the left has a thinner interlayer 4 compared to the structures 6 on the right.

The thickness of the interlayer 4 may be be tuned by the structure of a plurality of first ligands 2 and a plurality of second ligands in the interlayer 4. In particular, the thickness of the interlayer 4 is dependent on a length of the side chains 8, 10 of the first ligand and of the second ligand.

Figure 9:
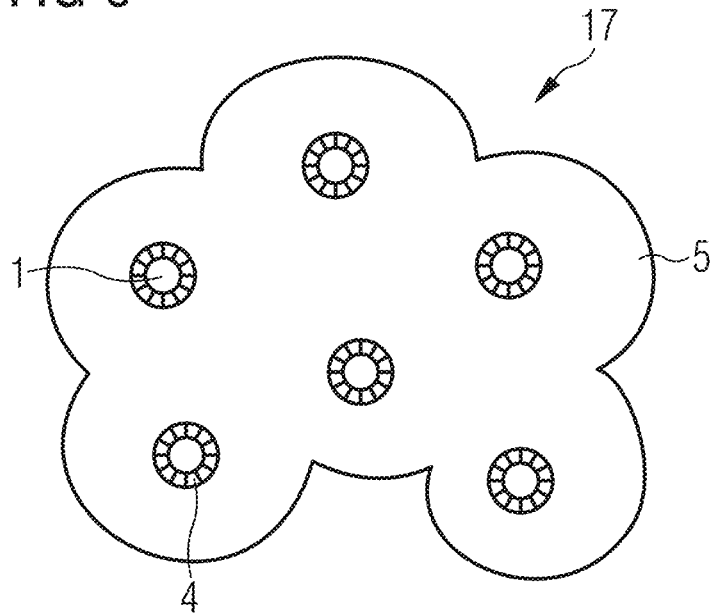
FIGS. 9 and 10 each show a schematic cross section of an agglomerate according to an exemplary embodiment.

FIG. 9 shows an agglomerate 17 according to an embodiment in a schematic sectional view. The agglomerate 17 comprises a plurality of structures 6, which are agglomerated with each other. The structures 6 each comprise a nanoparticle 1, an interlayer 4, and an encapsulation 5. In the agglomerate 17 at least two structures 6 are in direct contact with their encapsulations 5. At least two structures 6 are covalently bound to each other via their encapsulations 5. In other words, in the agglomerate 17 the plurality of nanoparticles 1 surrounded by a respective interlayer 4 has a common encapsulation 5. The agglomerate has a diameter ranging from at least 0.5 micrometers to at most 10 micrometers.

Figure 10:
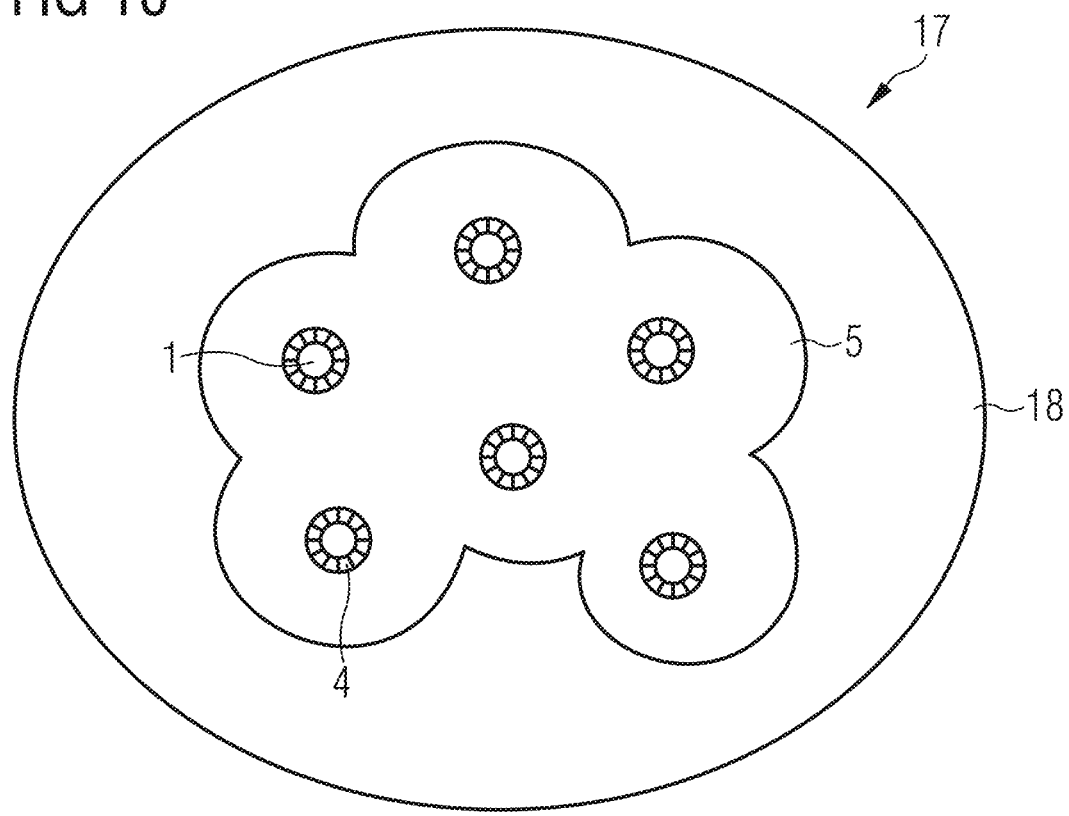

In FIG. 10 another embodiment of an agglomerate 17 is shown. The agglomerate 17 comprises a plurality of structures 6, which are agglomerated with each other by covalent bonding. The structure 6 comprises a nanoparticle 1, an interlayer 4, and an encapsulation 5. Compared to the exemplary embodiment shown in FIG. 9, the present agglomerate comprises also a further encapsulation 18 surrounding the plurality of structures 6.

Figure 11:
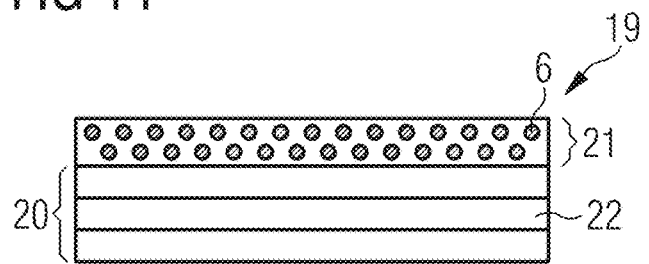
FIGS. 11 and 12 each show a schematic cross section of an optoelectronic device according to an exemplary embodiment.

FIG. 11 shows a schematic sectional cross section of an optoelectronic device 19 according to an embodiment. The optoelectronic device 19 comprises a semiconductor chip 20 and a conversion layer 21. The semiconductor chip 20 has an epitaxially grown semiconductor layer sequence with an active layer 22. The semiconductor chip 20 is configured to emit electromagnetic radiation of a first wavelength range. The electromagnetic radiation of the first wavelength range is generated in the active layer 22. In a further embodiment, the first wavelength range is in the UV to blue region of the electromagnetic radiation.

The conversion layer 21 is arranged on a radiation exit surface of the semiconductor chip 20. The conversion layer 21 comprises presently a plurality of structures 6. The structures 6 have the structure and composition as described in combination with FIG. 1 or FIG. 5. The plurality of structures 6 is embedded in a matrix material, such as an epoxy or a silicone. Alternatively, the conversion layer 21 is free of the matrix material. In other words, the structures 6 are not embedded in matrix material.

The conversion layer 21 is configured to convert electromagnetic radiation of the first wavelength range into electromagnetic radiation of a second wavelength range. The electromagnetic radiation of the first wavelength range is at least partially, or completely, different than the electromagnetic radiation of the second wavelength range. The second wavelength range is from 500 nanometers to 1000 nanometers, both inclusive.

Figure 12:
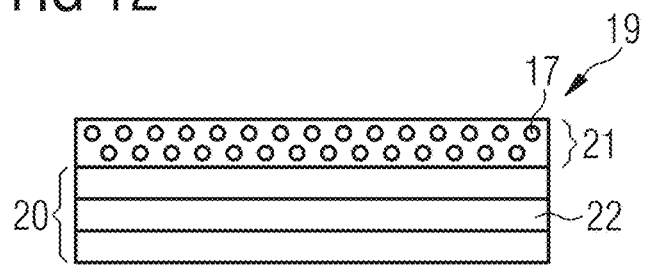

The optoelectronic device 19 according to an embodiment shown in FIG. 12 has a structure similar to the optoelectronic device 19 shown in FIG. 11. However, the optoelectronic device 19 of FIG. 12 comprises an agglomerate 17 instead of the structures 6 as shown in FIG. 11 in the conversion layer 21. Otherwise, the structure of the optoelectronic device 19 according to FIG. 12 is the same as described in combination with the optoelectronic device 19 according to FIG. 11.

Figure 13:
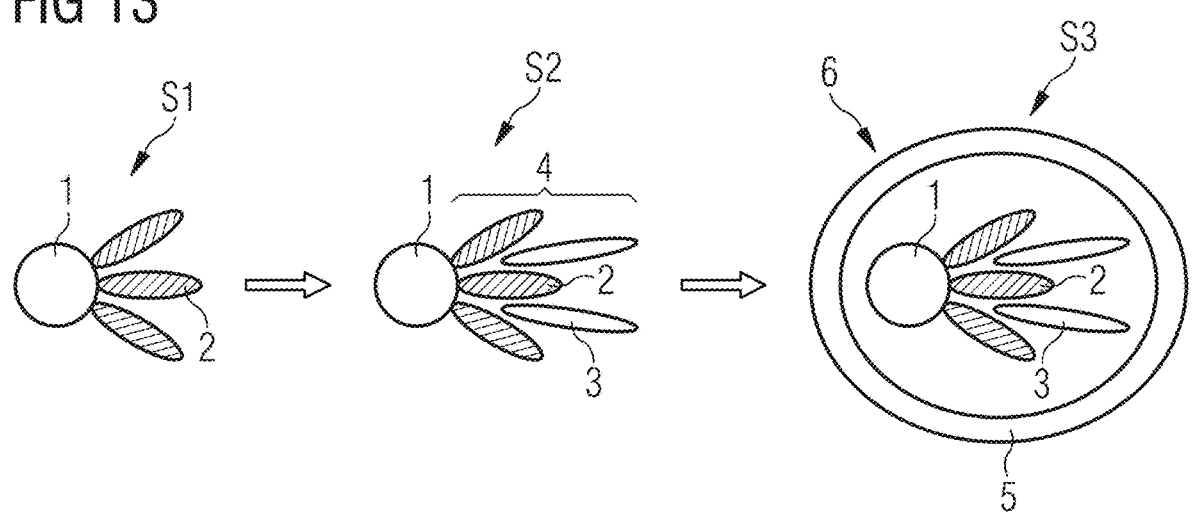
FIG. 13 shows methods steps for producing a structure according to an exemplary embodiment by means of schematic cross sections.

In FIG. 13 method steps for producing a structure 6 are shown. In a first step S1, a nanoparticle 1 is provided. The nanoparticle is configured to convert electromagnetic radiation of a first wavelength range into electromagnetic radiation of a second wavelength range. The nanoparticle 1 is a quantum dot having a core-shell-shell structure and comprising at least one semiconductor material. The nanoparticle 1 comprises a plurality of amphiphilic first ligands 2 on a surface. In other words, the nanoparticle 1 is surrounded by the plurality of first ligands 2. The first ligand 2 comprises a head group 7 and a side chain 8. The first ligands 2 are coordinatively bound to the surface of the nanoparticle 1 via the head group 7.

The nanoparticle 1 surrounded by the first ligands 2 is provided in a first solvent. The first solvent is a non-polar solvent, such as toluene, hexane, or chloroform.

A plurality of amphiphilic second ligands 3 is added to the nanoparticle 1 with the first ligands 2, such that an interlayer 4 is formed. This is the second step S2. The interlayer 4 comprises the first ligands 2 and the second ligands 3. The first ligands 2 are intercalated with the second ligands 3.

The nanoparticle 1 surrounded by the interlayer 4 is transferred to a second solvent. The second solvent is more polar than the first solvent. The second solvent may be methanol or ethanol. The nanoparticle 1 surrounded by the interlayer 4 may be transferred to a second solvent by first removing the first solvent through evaporation of the first solvent to give a film comprising the nanoparticle 1 surrounded by the interlayer 4 and then adding the second solvent. Alternatively, the nanoparticle 1 surrounded by the interlayer 4 is transferred to the second solvent by stirring of a biphasic system. The biphasic system comprises the first solvent with the nanoparticles 1 surrounded by the interlayer 4 and the second solvent.

To ensure a complete intercalation, the second ligand 3 is added in excess. The excess of the second ligands 3 is removed by precipitation and resuspension cycles using a 3rd solvent which is an anti-solvent to the second solvent. The first solvent is a non-polar solvent, such as toluene or hexane.

After the excess of the second ligands 3 is removed, the nanoparticle 1 surrounded by the interlayer 4 is dispersed in a solvent similar or identical to the second solvent such that a first solution is formed. A second solution comprising a non-polar solvent and a surfactant is added to this first solution. In that way, a third solution is formed. A silica source such as an alkoxy silane, for example tetraethyl orthosilicate (TEOS), water, and an acid or a base are added to the third solution. The silica source hydrolyzes such that an encapsulation 5 is formed around the interlayer 4. As a silica source is used to form the encapsulation 5, the encapsulation 5 comprises silica. The presently described method of forming the encapsulation 5 can also be described as a reverse micelle reaction. Forming the encapsulation 5 is the third step S3.

The previously described process of forming the encapsulation 5 is repeated at least once. In this way, a uniformly shaped encapsulation 5 is produced.

If the second ligands 3 comprises a reactive head group 9, such as $Si(OMe)_3$ or $Si(OEt)_3$, the head group 9 is integrated into the encapsulation 5. This is due to hydrolyzation of the silica source where the reactive head group 9 hydrolyzes and forms a covalent bond to the silicon and the encapsulation 5.

After the encapsulation 5 is formed around the interlayer 4, the finished structure 6 is obtained.

Figure 14:
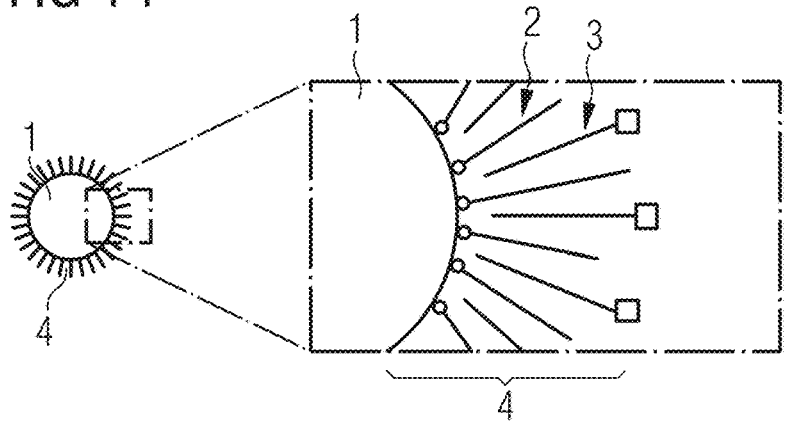
FIGS. 14, 15, 16, and 17 each show a schematic cross section of a nanoparticle with an interlayer.

FIG. 14 shows a nanoparticle 1 surrounded by an interlayer 4 obtained as an intermediate during the method for producing a structure 6. The nanoparticle 1 at least partially surrounded by the interlayer 4 is obtained after a plurality of second ligands 3 is added to the nanoparticle 1 surrounded by a plurality of first ligands 2. Presently, the first ligands 2 comprise a head group 7 and a side chain 8. The second ligands 3 comprise a head group 9 and a side chain 10. The first ligands 2 and the second ligands 3 are intercalated in such a way that the side chains 8, 10 interact with each other by van der Waals forces. The first ligands 2 are arranged such that the head group 7 is in direct contact with a surface of the nanoparticle 1. In other words, the side chain 8 of the first ligand 2 faces away from the nanoparticle 1. The second ligands 3 are arranged such that the side chain 10 points into the direction of the nanoparticle 1. However, the side chain 10 is not in direct contact with the surface of the nanoparticle 1. The head group 9 of the second ligand 3 forms a surface of the interlayer 4.

Figure 15:
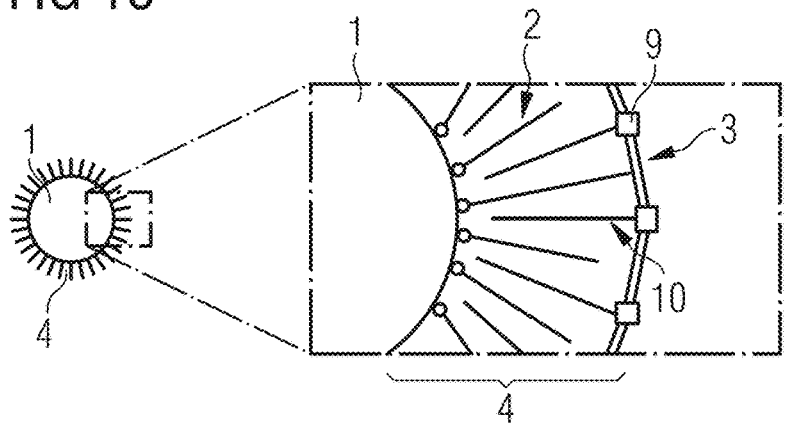

FIG. 15 also shows a nanoparticle 1 surrounded by an interlayer 4. Compared to the nanoparticle 1 surrounded by the interlayer 4 shown in FIG. 14, the presently shown nanoparticle 1 surrounded by an interlayer 4 comprises polymeric second ligands 3. Otherwise, the structure of the nanoparticle 1 surrounded by the interlayer 4 is the same as described in combination with FIG. 14. The polymeric second ligand 3 comprises a polar backbone with a plurality of polar head groups 9 and a plurality of non-polar side chains 10. The polymeric second ligand 3 is intercalated into the first ligands 2 such that the side chains 10 of the second ligand 3 interact with the side chains 8 of the first ligands 2.

Figure 16:
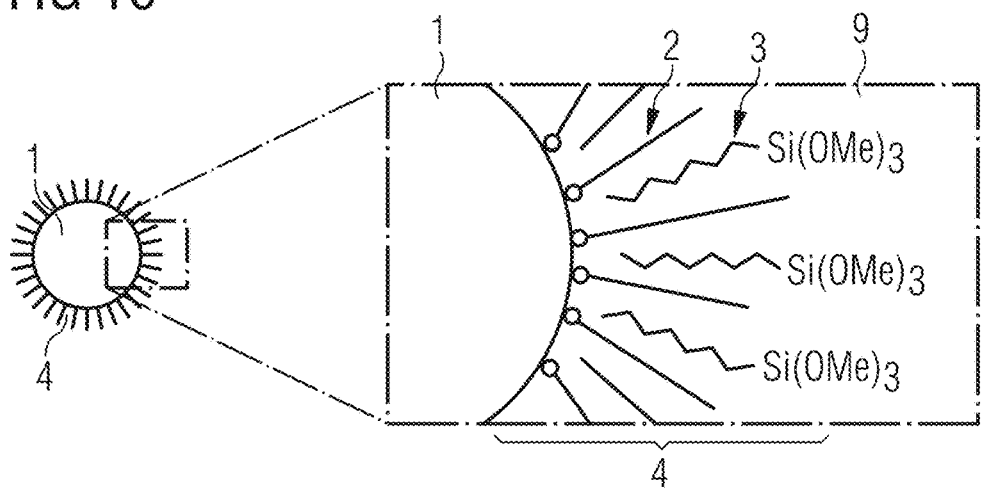

The nanoparticle 1 surrounded by an interlayer 4 shown in FIG. 16 comprises a plurality of second ligands 3 in the interlayer 4 which have a reactive head group 9 and a side chain 10. The second ligand 3 is trimethoxy(octyl)silane. The reactive head group 9 is Si (OMe)$_3$. The side chain 10 is presently an alkyl chain comprising eight carbon atoms. The side chains 8 of the first ligands 2 and the side chains 10 of the second ligands 3 interact by van der Waals forces.

Figure 17:
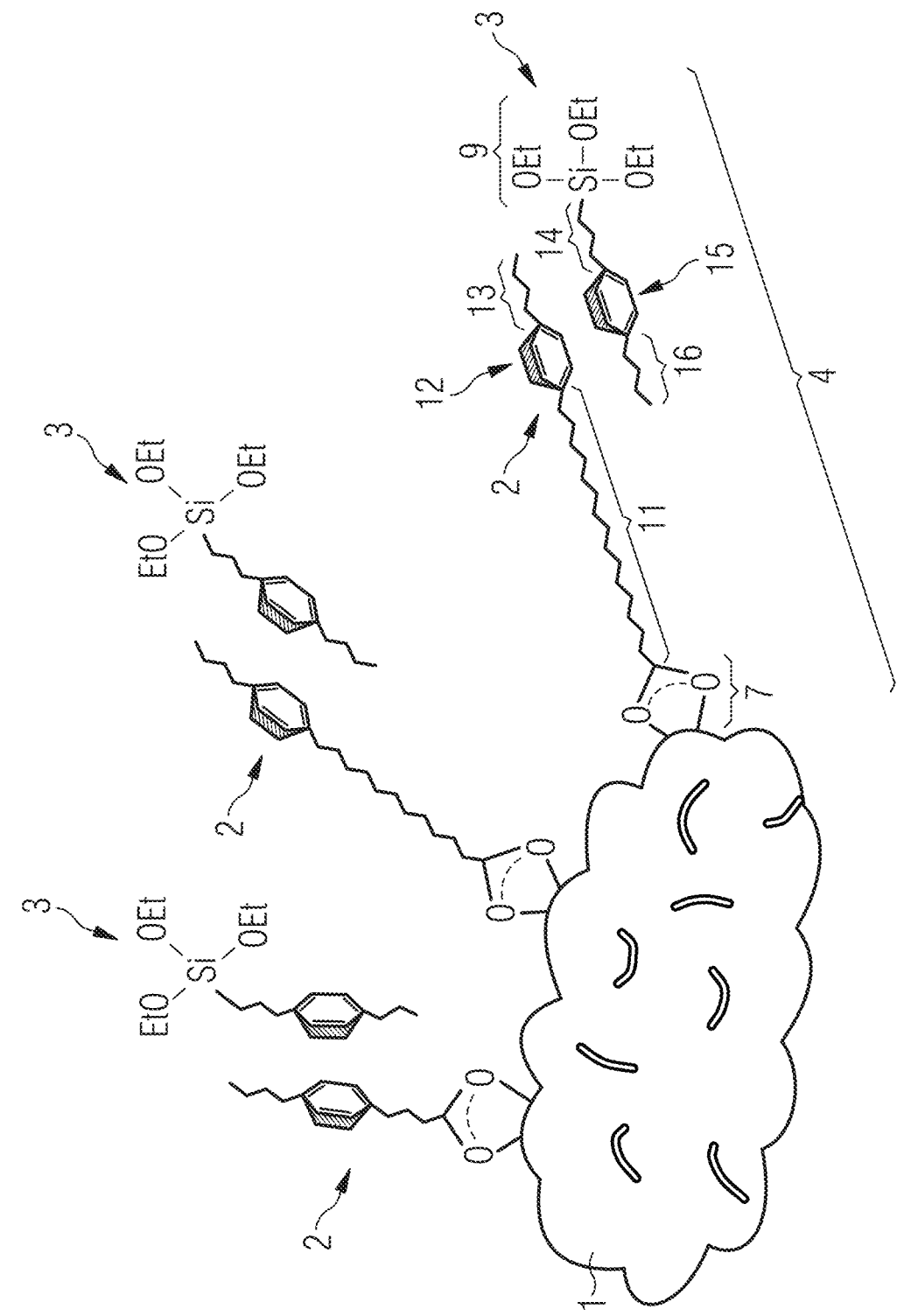

In FIG. 17 a nanoparticle 1 surrounded by an interlayer 4 is shown. The interlayer 4 comprises first ligands 2 and second ligands 3. Presently, the interlayer 4 comprises a plurality of three different first ligands 2. Each of the first ligands 2 comprises a carboxylate as head group 7. Each carboxylate is coordinatively bound to a surface of the nanoparticle 1. The first ligands 2 further comprise a spacer group 11, an aromatic group 12, and a terminal group 13.

The spacer group 11 is an alkyl chain. The spacer groups 11 of the three different first ligands 2 have a different chain length. The chain length of the left first ligand 2 is three carbon atoms, the chain length of the first ligand 2 in the middle is six carbon atoms, and the chain length of the first ligand 2 on the right is twelve carbon atoms. The aromatic groups 12 of the different first ligands 2 are each a phenyl group. The terminal groups 13 are alkyl chains with a chain length of three or four carbon atoms.

The interlayer 4 presently comprises a plurality of three different second ligands 3. Each of the second ligands 3 comprises a head group 9 which is presently a reactive head group comprising Si(OEt)$_3$. The second ligands 3 each further comprise a spacer group 14, an aromatic group 15, and a terminal group 16. The terminal groups 16 and the spacer groups 14 are presently alkyl chains.

In the interlayer 4, the spacer groups 11 of the first ligands 2 interact through van der Waals forces with the terminal groups 16 of the second ligands 3. The aromatic groups 12 of the first ligands 2 interact through n-stacking with the aromatic group 15 of the second ligand 3. The terminal groups 13 of the first ligand 2 interact through van der Waals forces with the spacer group 14 of the second ligand 3.

Figure 18:
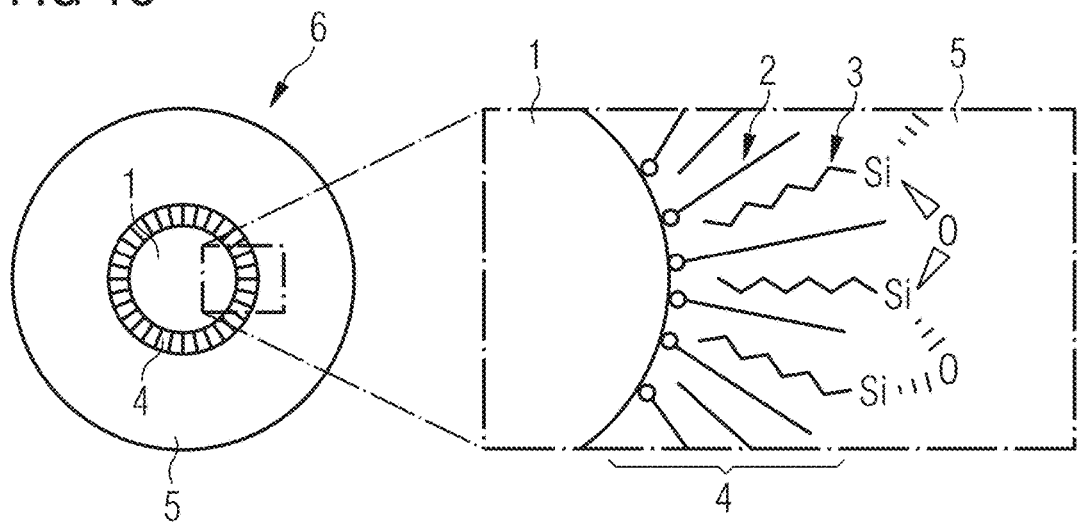
FIG. 18 shows a schematic cross section of a structure according to an exemplary embodiment.

FIG. 18 shows a schematic cross sectional view of a structure 6 according to an exemplary embodiment. The structure 6 comprises a nanoparticle 1, an interlayer 4, and an encapsulation 5. The interlayer 4 is arranged between the nanoparticle 1 and the encapsulation 5. The interlayer 4 comprises first ligands 2 which are in direct contact with a surface of the nanoparticle 1. The first ligands 2 comprises a head group 7 and a side chain 8. The first ligands 2 may be bound to the surface of the nanoparticle 1 by at least a coordinative bond of a head group 7 to the nanoparticle 1.

The interlayer 4 further comprises second ligands 3. The second ligands 3 comprise a head group 9 and a side chain 10. The head group 9 is presently integrated into the encapsulation 5. In other words, the head group 9 of the second ligands 3 has at least one covalent bond to a material of the encapsulation 5. At present, the head group 9 comprises a silicon atom, and the encapsulation 5 comprises silica. The silicon atom of the head group 9 is bound to oxygen atoms of the silica of the encapsulation 5.

Figure 19:
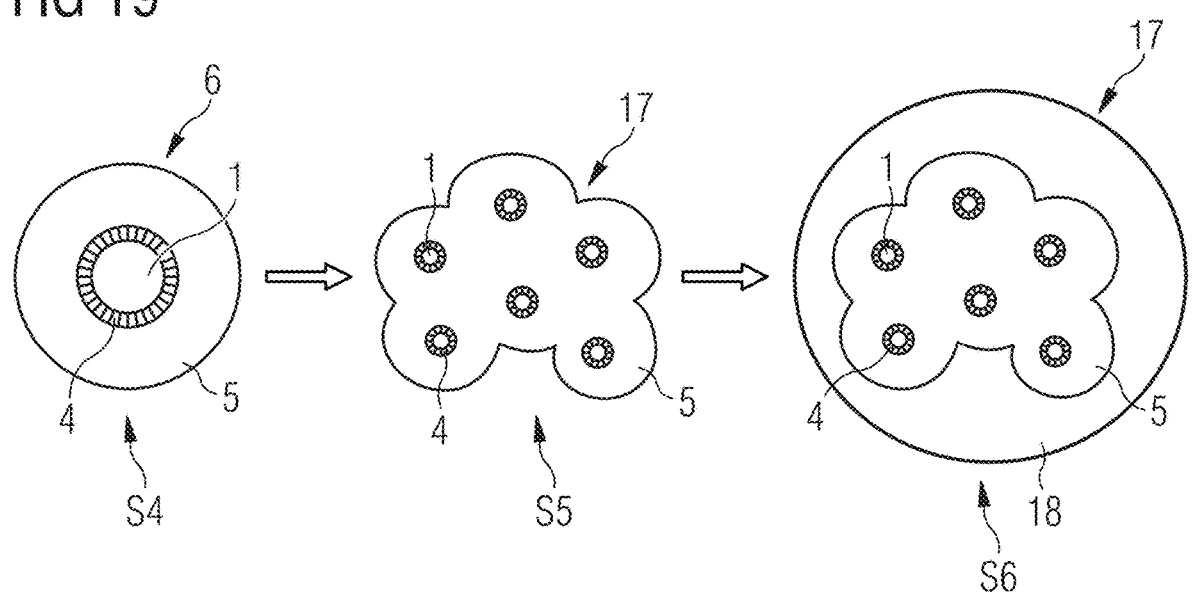
FIG. 19 shows methods steps for producing an agglomerate according to an exemplary embodiment by means of schematic cross sections.

In combination with FIG. 19, a method for producing an agglomerate 17 is described. In a first step S4, a plurality of structures 6 are provided in a solvent. The structures 6 each comprise a nanoparticle 1 surrounded by an interlayer 4 and an encapsulation 5. The interlayer 4 is arranged between the nanoparticle 1 and the encapsulation 5. For example, the structures 6 comprise a structure as described in combination with FIG. 1, 5, or 18.

In a second step S5, the plurality of structures 6 are agglomerated by adding an anti-solvent or a salt or removing the solvent. In this way an agglomerate 17 is formed. In the agglomerate 17, the encapsulations 5 of the structures 6 are in direct contact. The encapsulations 5 of two adjacent structures 6 are covalently bound to each other. In other words, in the agglomerate 17 a plurality of nanoparticles 1 shares a common encapsulation 5.

In a third step S6, the agglomerate 17 is further encapsulated. This is achieved by forming a further encapsulation 18 around the agglomerate 17. Forming a further encapsulation 18 around the agglomerate 17 comprises treating the agglomerate with a silica source such as TEOS. Thus, the further encapsulation 18 comprises or consists of silica.

Figure 20:
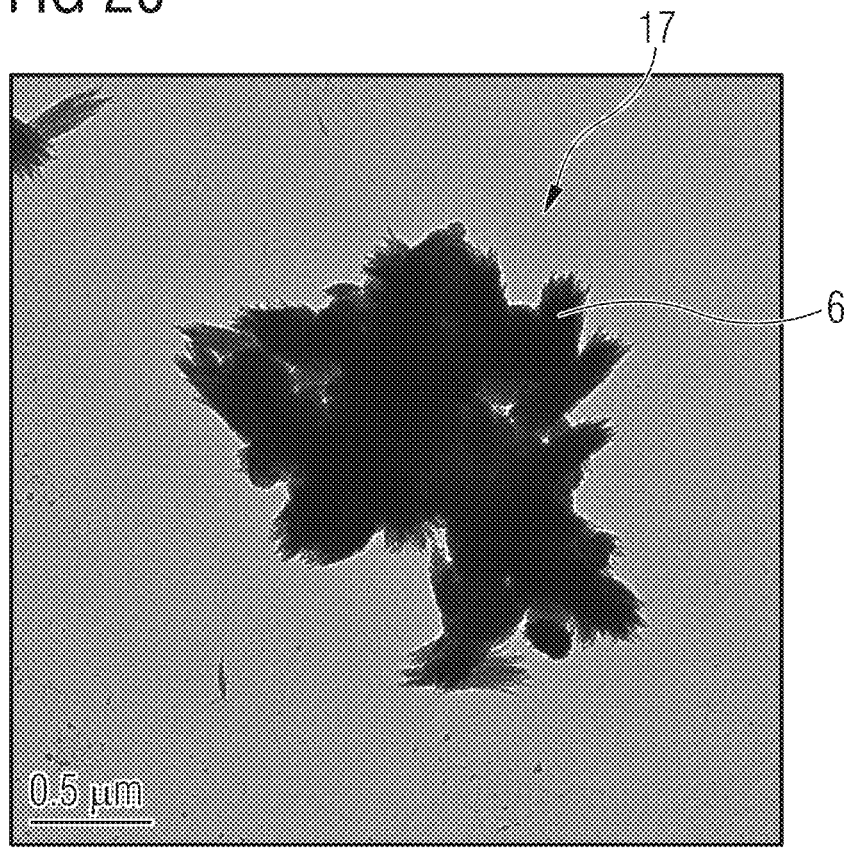
FIG. 20 shows a transmission electron microscopy image of structures according to an exemplary embodiment.

FIG. 20 shows a transmission electron microscopy (TEM) image of structures 6 according to an exemplary embodiment. Each structure 6 comprises a nanoparticle 1, an interlayer 4, and an encapsulation 5. The nanoparticle 1 is configured to convert electromagnetic radiation of a first wavelength range into electromagnetic radiation of a second wavelength range. Presently, a plurality of structures 6 is agglomerated such that an agglomerate 17 is formed.

The nanoparticle 1 is a quantum dot with a core-shell-shell structure, comprising a CdSe core, a CdS shell, and a ZnS shell. The interlayer 4 comprises a first ligand 2 and a second ligand 3. The encapsulation 5 consists of silica. The encapsulation 5 has an uneven surface.

The features and exemplary embodiments described in connection with the figures may be combined with each other according to further exemplary embodiments, even if not all combinations are explicitly described. Furthermore, the exemplary embodiments described in connection with the figures may have alternative or additional features as described in the general part.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

REFERENCES 1 nanoparticle
2 first ligand
3 second ligand
4 interlayer
5 encapsulation
6 structure
7, 9 head group
8, 10 side chain
11, 14 spacer group
12, 15 aromatic group
13, 16 terminal group
17 agglomerate
18 further encapsulation
19 optoelectronic device
20 semiconductor chip
21 conversion element
22 active layer
S1, S4 first step
S2, S5 second step
S3, S6 third step

The invention claimed is:

1. A structure comprising:
   a nanoparticle configured to convert electromagnetic radiation of a first wavelength range into electromagnetic radiation of a second wavelength range;
   an interlayer at least partially surrounding the nanoparticle; and
   an encapsulation at least partially surrounding the interlayer;
   wherein:
   the interlayer comprises a plurality of first amphiphilic ligands and a plurality of second amphiphilic ligands;
   the first ligands and the second ligands are intercalated;
   at least one of the second ligands is a polymer;
   the polymer comprises a polar backbone and a plurality of non-polar side chains; and
   the polar backbone comprises a plurality of polar head groups.

2. The structure according to claim 1, wherein the encapsulation comprises a thickness ranging from 10 nanometers to 100 nanometers, both inclusive.

3. The structure according to claim 1, wherein the encapsulation comprises a material selected from the group consisting of silica, alumina, titania, and combinations thereof.

4. The structure according to claim 1, wherein the first ligands and the second ligands interact through a bonding selected from the group consisting of van der Waals forces, π-stacking, covalent bonding, and combinations thereof.

5. The structure according to claim 1, wherein
   the first ligands comprises a polar head group and a non-polar side chain;
   the non-polar side chain comprises a spacer group, an aromatic group, and a terminal group; and
   the spacer group and the terminal group comprise an alkyl chain or an alkenyl chain.

6. The structure according to claim 1, wherein
   the interlayer comprises an additive selected from the group consisting of: ligands, quantum dots, growth reagents, reducing agents, lubricants, plasticizers, and combinations thereof.

7. An agglomerate comprising a plurality of structures, wherein each of the structures of the plurality of structures is a structure according to claim 1, wherein the structures are agglomerated with each other by a bonding selected from the group consisting of covalent bonding, coordinative bonding, and combinations thereof.

8. The agglomerate according to claim 7, wherein the agglomerate comprises a diameter ranging from 0.5 micrometers to 10 micrometers, both inclusive.

9. An optoelectronic device comprising:
   a semiconductor chip comprising an epitaxially grown semiconductor layer sequence configured to emit electromagnetic radiation of a first wavelength range; and
   a conversion layer comprising the agglomerate according to claim 8, said conversion layer configured to convert the electromagnetic radiation of the first wavelength range into electromagnetic radiation of a second wavelength range.

10. An optoelectronic device comprising:
    a semiconductor chip comprising an epitaxially grown semiconductor layer sequence configured to emit electromagnetic radiation of a first wavelength range; and
    a conversion layer comprising the structure according to claim 1, said conversion layer configured to convert the electromagnetic radiation of the first wavelength range into electromagnetic radiation of a second wavelength range.

11. A method for producing an agglomerate, wherein the method comprises:
    providing a plurality of structures in a solvent, wherein each of the structures of the plurality of structures is a structure according to claim 1; and
    agglomerating the plurality of structures with each other by at least one method selected from the group consisting of adding an antisolvent, adding a salt, removing the solvent, and combinations thereof.

12. A method for producing a structure, wherein the method comprises:
    providing a nanoparticle configured to convert electromagnetic radiation of a first wavelength range into electromagnetic radiation of a second wavelength range, said nanoparticle comprising a plurality of amphiphilic first ligands on a surface;
    forming an interlayer at least partially around the nanoparticle by adding a plurality of amphiphilic second ligands to the nanoparticle, wherein the interlayer comprises the first ligands and the second ligands and wherein the first ligands and the second ligands are intercalated;
    dispersing the nanoparticle at least partially surrounded by the interlayer in a polar solvent to form a first solution after forming the interlayer;
    adding the first solution to a second solution comprising a non-polar solvent and a surfactant to form a third solution; and forming an encapsulation at least partially around the interlayer, wherein forming the encapsulation at least partially around the interlayer comprises adding a reagent selected from the group consisting of a silica source, water, an acid, a base, and combinations thereof to the third solution.

13. The method according to claim 12, wherein
the second ligands comprises a reactive head group comprising a SiR3 group; wherein
each R is independently selected from the group comprising H, OMe, OEt, OiPr, Cl, Br.

14. The method according to claim 12, wherein:
the encapsulation comprises silica, and
forming the encapsulation at least partially around the interlayer comprises growing the silica using a reverse micelle method.

15. The method according to claim 12, wherein:
the encapsulation comprises silica, and
forming the encapsulation at least partially around the interlayer comprises treating with an alkoxy silane.

16. The method according to claim 12, wherein
the nanoparticle with the plurality of first ligands is provided in a first solvent; and
further comprising
adding the plurality of second ligands to the nanoparticle with the plurality of first ligands in the first solvent.

17. The method according to claim 16, further comprising:
removing the first solvent after the addition of the plurality of second ligands; and
transferring the nanoparticle to a second solvent after the first solvent is removed;
wherein the first solvent is a less polar than the second solvent.

18. The method according to claim 16,
further comprising:
transferring the nanoparticle to a second solvent by stirring of a biphasic system after the addition of the plurality of second ligands; wherein
the first solvent is less polar than the second solvent.

19. A method for producing a structure, wherein the method comprises:
providing a nanoparticle configured to convert electromagnetic radiation of a first wavelength range into electromagnetic radiation of a second wavelength range, said nanoparticle comprising a plurality of amphiphilic first ligands on a surface;
forming an interlayer at least partially around the nanoparticle by adding a plurality of amphiphilic second ligands to the nanoparticle, wherein the interlayer comprises the first ligands and the second ligands and wherein the first ligands and the second ligands are intercalated; forming an encapsulation at least partially around the interlayer; wherein
the nanoparticle with the plurality of first ligands is provided in a first solvent; and
further comprising
adding the plurality of second ligands to the nanoparticle with the plurality of first ligands in the first solvent; and
further comprising:
removing the first solvent after the addition of the plurality of second ligands; and
transferring the nanoparticle to a second solvent after the first solvent is removed;
wherein the first solvent is a less polar than the second solvent.

* * * * *

UNITED STATES PATENT AND TRADEMARK OFFICE
CERTIFICATE OF CORRECTION

| | | |
|---|---|---|
| PATENT NO. | : 12,125,951 B2 | Page 1 of 1 |
| APPLICATION NO. | : 17/530543 | |
| DATED | : October 22, 2024 | |
| INVENTOR(S) | : Erik Johansson et al. | |

It is certified that error appears in the above-identified patent and that said Letters Patent is hereby corrected as shown below:

In the Claims

In Claim 4, Column 21, Line 65:
Change "x-stacking" to --π-stacking--

In Claim 5, Column 22, Line 2:
Change "comprises" to --comprise--

In Claim 13, Column 23, Line 8:
Change "comprises" to --comprise--

Signed and Sealed this
Tenth Day of December, 2024

Katherine Kelly Vidal
*Director of the United States Patent and Trademark Office*